(12) United States Patent
Sato et al.

(10) Patent No.: US 11,293,989 B2
(45) Date of Patent: Apr. 5, 2022

(54) ANOMALY DETECTION DEVICE, ANOMALY DETECTION METHOD, AND RECORDING MEDIUM

(71) Applicant: NEC Corporation, Tokyo (JP)

(72) Inventors: Shizuka Sato, Tokyo (JP); Takazumi Kawai, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/964,657

(22) PCT Filed: Mar. 15, 2018

(86) PCT No.: PCT/JP2018/010290
§ 371 (c)(1),
(2) Date: Jul. 24, 2020

(87) PCT Pub. No.: WO2019/176063
PCT Pub. Date: Sep. 19, 2019

(65) Prior Publication Data
US 2021/0055350 A1    Feb. 25, 2021

(51) Int. Cl.
*G01R 31/367* (2019.01)
*G06F 1/28* (2006.01)

(52) U.S. Cl.
CPC .............. *G01R 31/367* (2019.01); *G06F 1/28* (2013.01)

(58) Field of Classification Search
None
See application file for complete search history.

(56) References Cited

U.S. PATENT DOCUMENTS

2019/0149089 A1*  5/2019  Xu .................. H02S 50/10
                                            324/761.01

FOREIGN PATENT DOCUMENTS

| JP | 2007-274827 A | 10/2007 |
|----|---------------|---------|
| JP | 2013-175108 A | 9/2013 |
| JP | 2014-039353 A | 2/2014 |
| JP | 2015-036961 A | 2/2015 |
| JP | 2015-059933 A | 3/2015 |
| JP | 2017-021702 A | 1/2017 |
| JP | 2017-026616 A | 2/2017 |
| JP | 2018-019552 A | 2/2018 |
| WO | 2015/019863 A1 | 2/2015 |

OTHER PUBLICATIONS

Ozgonenel et al. ("Detection of Blackouts by Using K-Means Clustering in a Power System", 11th IET International Conference on Developments in Power Systems Protection (DPSP 2012), 2012, pp. 1-6) (Year: 2012).*

(Continued)

*Primary Examiner* — Roy Y Yi
(74) *Attorney, Agent, or Firm* — Sughrue Mion, PLLC

(57) ABSTRACT

An anomaly detection device includes: at least one memory configured to store instructions; and at least one processor configured to execute the instructions to: cluster a plurality of power storage systems into a plurality of clusters; generate a detection model for detecting an anomaly in the power storage systems for each of the clusters; and detect an anomaly in the power storage system for each of the clusters by using the detection model associated with the cluster.

9 Claims, 11 Drawing Sheets

(56) References Cited

OTHER PUBLICATIONS

Pfenninger ("Dealing with multiple decades of hourly wind and PV time series in energy models: A comparison of methods to reduce time resolution and the planning implications of inter-annual variability," Applied Energy, vol. 197, 2017, pp. 1-13). (Year: 2017).*
Ding (Pattern Recognition Studies of Complex Spectroscopic Data Sets, Oklahoma State University, Stillwater, 2009) (Year: 2009).*
International Search Report for PCT/JP2018/010290 dated May 1, 2018 (PCT/ISA/210).
Written Opinion for PCT/JP2018/010290 dated May 1, 2018 (PCT/ISA/237).

* cited by examiner

ANOMALY DETECTION DEVICE, ANOMALY DETECTION METHOD, AND RECORDING MEDIUM

CROSS REFERENCE TO RELATED APPLICATIONS

This application is a National Stage of International Application No. PCT/JP2018/010290 filed Mar. 15, 2018, the disclosure of which is incorporated herein in its entirety by reference.

TECHNICAL FIELD

The present disclosure relates to an anomaly detection device of a power storage system, and the like.

BACKGROUND ART

As renewable energy from photovoltaic power generation or the like has become widespread, it has been expected that a power storage system spreads throughout the society, the power storage system contributing to a peak shift and power saving/economizing by storing night-time power in conjunction with a power system and the photovoltaic power generation. In order to achieve stable power supply performed by the power storage system, it is essential to grasp a state of the power storage system and detect an anomaly thereof.

In detection of an anomaly in a power storage system, there is a possibility that some anomaly is inherent in the power storage system before the anomaly becomes apparent, and measured data during a period before the anomaly becomes apparent cannot be treated as measured data during a period while the power storage system is normal. Therefore, a detection model is generated by using measured data of another normal power storage system, and a difference between a predicted value derived from the detection model and an actually measured value of the power storage system is compared with a predetermined threshold value, whereby the anomaly in the power storage system is detected.

CITATION LIST

Patent Literatures

[PTL 1] Japanese Unexamined Patent Application Publication No. 2007-274827
[PTL 2] Japanese Unexamined Patent Application Publication No. 2013-175108
[PTL 3] Japanese Unexamined Patent Application Publication No. 2015-036961
[PTL 4] Japanese Unexamined Patent Application Publication No. 2017-026616
[PTL 5] International Publication No. WO 2015/019863
[PTL 6] Japanese Unexamined Patent Application Publication No. 2017-021702

SUMMARY OF INVENTION

Technical Problem

In a power storage system, an individual difference occurs by a difference in operation or by being affected by an environment. In a case of using a detection model generated by a large number of power storage systems, a threshold value range of anomaly detection expands due to threshold value setting that considers an individual difference among the power storage systems in order to avoid erroneous detection, and performance of the anomaly detection degrades.

An object of the present disclosure is to provide an anomaly detection device and the like that suppress degradation of performance for detecting an anomaly in the power storage system.

Solution to Problem

One aspect of an anomaly detection device according to the present disclosure includes: at least one memory configured to store instructions; and at least one processor configured to execute the instructions to: cluster a plurality of power storage systems into a plurality of clusters; generate a detection model for detecting an anomaly in the power storage systems for each of the clusters; and detect an anomaly in the power storage system for each of the clusters by using the detection model associated with the cluster.

One aspect of an anomaly detection method according to the present disclosure includes: clustering a plurality of power storage systems into a plurality of clusters; generating a detection model for detecting an anomaly in the power storage system for each of the clusters; and detecting an anomaly in the power storage system for each of the clusters by using the detection model associated with the cluster.

One aspect of a program stored in a recording medium according to the present disclosure causes a computer to execute: clustering a plurality of power storage systems into a plurality of clusters; generating a detection model for detecting an anomaly in the power storage system for each of the clusters; and detecting an anomaly in the power storage system for each of the clusters by using the detection model associated with the cluster.

Advantageous Effects of Invention

According to the anomaly detection device of the present disclosure, performance for detecting an anomaly in the power storage system can be improved.

EXAMPLE EMBODIMENT

Figure 1:
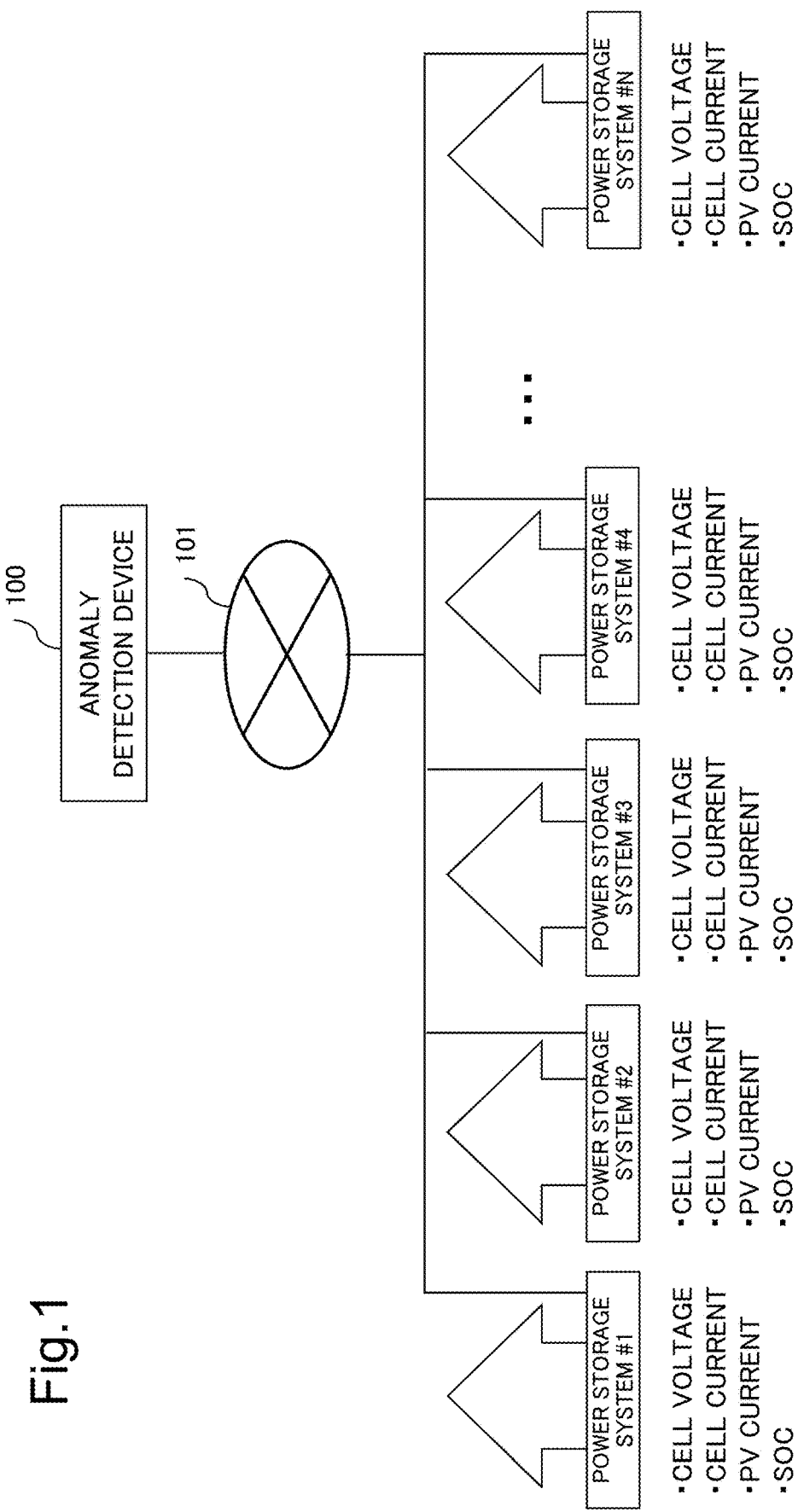
FIG. 1 is a diagram illustrating an overview of an anomaly detection device connected to power storage systems.

An anomaly detection device according to a first example embodiment will be described with reference to the drawings. FIG. 1 is a conceptual diagram illustrating the anomaly detection device connected to power storage systems. As illustrated in FIG. 1, an anomaly detection device 100 is connected to power storage systems #1 to #N (N is a natural number of 2 or more) via a network 101. The power storage systems #1 to #N include chargeable/dischargeable storage batteries (not shown). The power storage systems are, for example, power storage systems for housing, business or industrial purposes. One example of such a storage battery is a lithium ion secondary battery.

Moreover, in the example of the first example embodiment, it is assumed that each of the power storage systems is provided with a power conditioning system (PCS) and a battery management unit (BMU). The PCS is a device that converts generated power of a photovoltaic (PV) cell or fuel cell or the like into system power. The BMU is a device that measures voltages of the cells in each of the storage batteries by sensors provided in the power storage system, maintains a voltage balance between the cells, and monitors/controls the storage batteries of the power storage system.

The sensors of the power storage system measure cell currents and the like as well as such cell voltages of the power storage system. A power generation voltage and a power generation current, which are output by the PCS, or inter-cell voltages measured by the BMU may also be treated as sensor values measured by the power storage system. Each of the power storage systems #1 to #N calculates a state of charge (SOC) on the basis of the sensor values thus measured. Each of the power storage systems #1 to #N outputs the SOC calculated thereby or the measured sensor values as information indicating a state of the power storage system. The anomaly detection device 100 detects anomalies in the power storage systems by using the information output from the power storage systems #1 to #N.

The power storage systems #1 to #N do not have to be the same power storage systems, and may be different from one another in terms of characteristics of the storage batteries, such as a discharge capacity. Moreover, the power storage systems may be different from one another in terms of specifications such as whether there is photovoltaic power generation.

Figure 2:
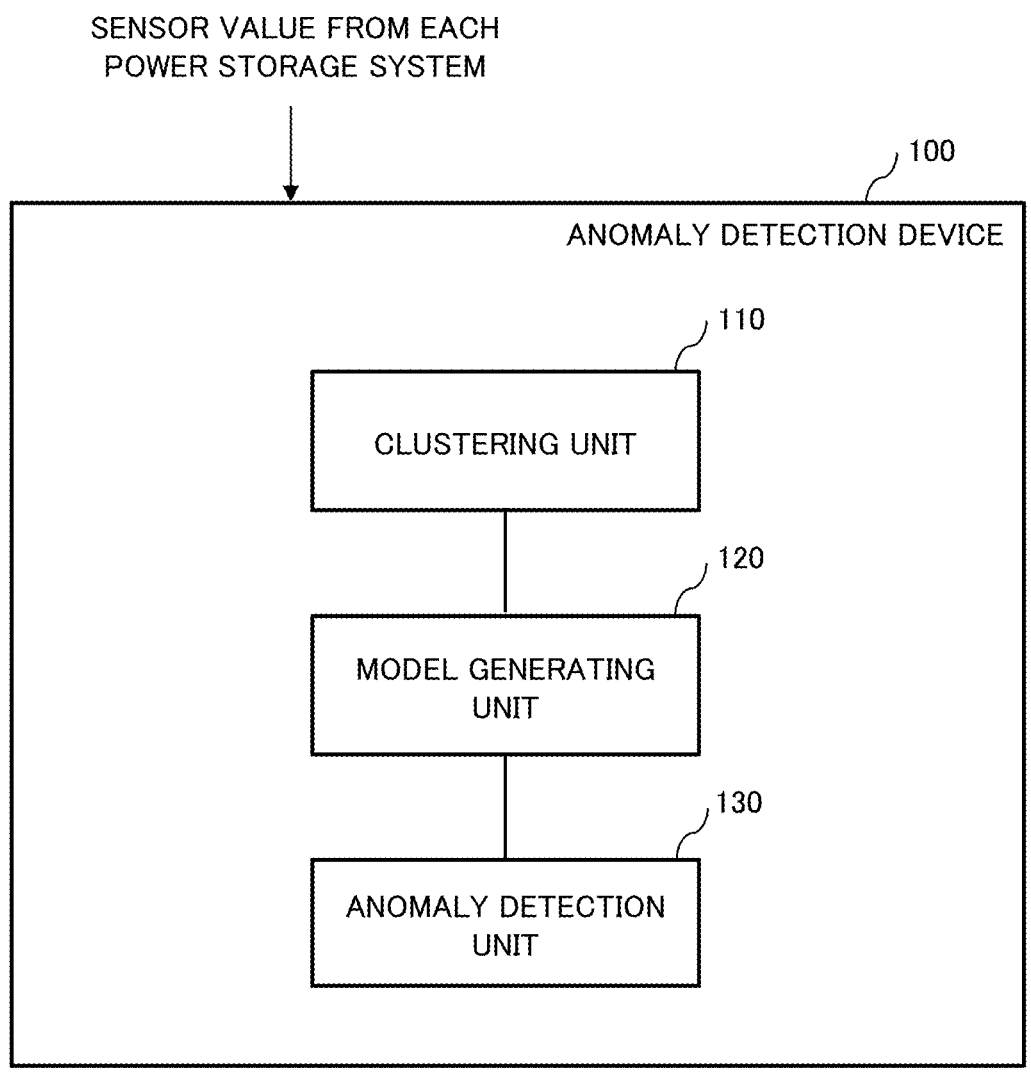
FIG. 2 is a block diagram illustrating one example of a configuration of the anomaly detection device according to a first example embodiment.

A configuration of the anomaly detection device and an anomaly detection method according to the first example embodiment will be described more in detail with reference to the drawings. FIG. 2 is a block diagram illustrating one example of a configuration of the anomaly detection device 100 according to the first example embodiment. The anomaly detection device 100 illustrated in FIG. 2 includes a clustering unit 110, a model generating unit 120, and an anomaly detection unit 130.

The clustering unit 110 constitutes clustering means for clustering a plurality of power storage systems into a plurality of clusters on the basis of information indicating states of the power storage systems. The clustering unit 110 clusters the power storage systems #1 to #N into a plurality of clusters on the basis of the information output individually from the power storage systems #1 to #N. Note that, in terms of performing the clustering more accurately, it is desirable to cluster the power storage systems #1 to #N into a plurality of clusters on the basis of the SOCs calculated by the power storage systems #1 to #N.

More specifically, the clustering unit 110 clusters the power storage systems #1 to #N into the plurality of clusters on the basis of time-series fluctuations of the information indicating the states of the power storage systems #1 to #N. The information for use in the clustering is, for example, the SOCs indicating states of charge of the power storage systems. The clustering unit 110 clusters the power storage systems #1 to #N into the plurality of clusters, for example, by a hierarchical method such as a minimum distance method and a maximum distance method and dynamic time warping (DTW).

Figure 3:
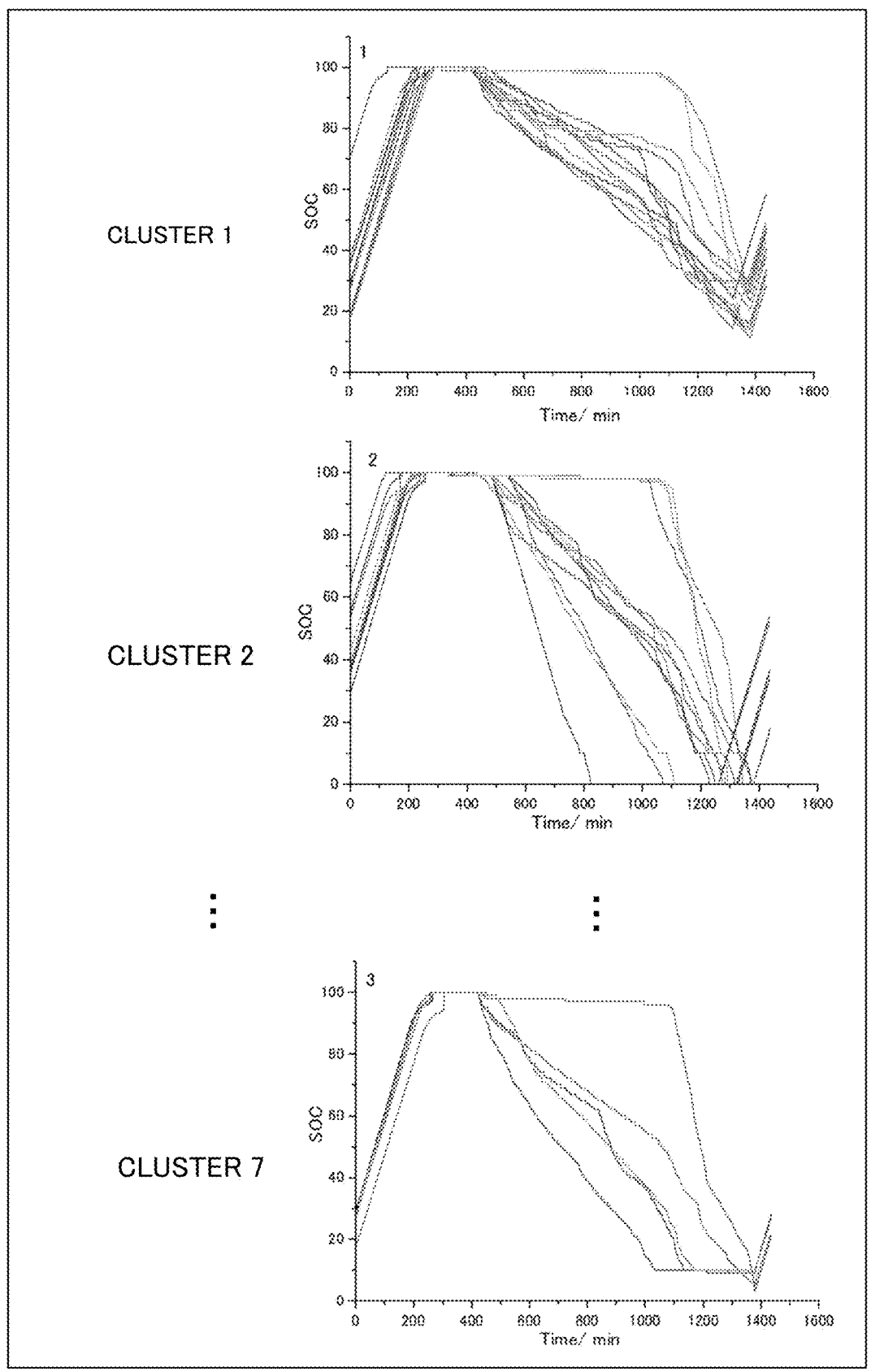
FIG. 3 is graphs illustrating examples of clustering a plurality of power storage systems into a plurality of clusters on the basis of time-series fluctuations of states of charge (SOCs) of the power storage systems.

FIG. 3 is graphs illustrating examples of clustering the plurality of power storage systems into the plurality of clusters on the basis of the time-series fluctuations of the SOCs of the power storage systems. The graphs in FIG. 3 represent the time-series fluctuations of the SOCs of the plurality of power storage systems in each of the clusters. Vertical axes of the graphs are the SOCs, and horizontal axes are time (minutes). A range of the time series of each SOC is defined to be a period while the power storage system starts a charge, then discharges after being fully charged, and starts another charge. In FIG. 3, display of the clusters 3 to 6 is omitted.

By the clustering of the clustering unit 110, each of the clusters becomes an aggregate of power storage systems similar to one another in terms of the fluctuations of the SOCs. For example, the cluster 1 becomes such an aggregate in which "the charge is started when the SOC reaches 10", the cluster 2 becomes such an aggregate in which "the charge is started after the SOC reaches 0", and the cluster 7 becomes such an aggregate in which "the discharge is stopped when the SOC reaches 10, and after a while, the charge is started". That is, by the clustering, aggregates are formed, in which operations of the power storage systems are similar to one another in each of the clusters. It can also be said that the plurality of clusters 1 to 7 are clustered according to operations of the power storage systems #1 to #N. Note that the operations of the power storage systems are not limited to such pieces of charge timing as described above. For example, ranges of the operations may be an upper limit or lower limit of the SOCs of the power storage systems.

Moreover, the clusters may be further distinguished by paying attention to how the power storage systems are used. For example, how the power storage systems are used may differ between weekdays and holidays. Therefore, the clustering unit 110 may perform the clustering after distinguishing such pieces of the information indicating the states of the power storage systems into those in weekdays and those in holidays in advance. Moreover, product specifications of the power storage systems may be determined depending on the operations of the power storage systems or how the power storage systems are used. Therefore, the clustering unit 110 may cluster the plurality of power storage systems into the plurality of clusters on the basis of information indicating manufacturers' names or model numbers of the power storage systems.

Moreover, values may be used, which are acquired by acquiring moving averages of the time-series data of the information indicating the states of the power storage systems. Use of the values acquired from the moving averages makes it possible to remove noise data in the time-series data of the information.

The SOC of each power storage system is one example of information indicating the state of the power storage system, and can also be said to be an index indicating the operation of the power storage system or how the power storage system is used. Note that, the plurality of power storage systems may be clustered into the plurality of clusters on the basis of, as well as the SOC, such information in which the state of each power storage system repeatedly fluctuates during a certain period. For example, cell voltages or cell currents of the storage batteries in the power storage systems also fluctuate during a daytime or during a few days, and accordingly, can be applied for the clustering to the plurality of power storage systems as the information indicating the states of the power storage systems.

The model generating unit 120 constitutes model generating means for generating a detection model for detecting anomalies in the power storage systems for each of the clusters. Moreover, the anomaly detection unit 130 constitutes detecting means for detecting the anomalies in the power storage systems for each of the clusters by using the detection model generated in response to the cluster.

Referring to an example made by an invariant analysis, a description will be given below of generating of the detection model for detecting the anomalies in the first example embodiment and of detection of the anomalies in the power storage systems, which uses the generated detection model. See the description of PTL 6 for details of the invariant analysis.

From a plurality of the sensor values indicating the states of the power storage systems #1 to #N, the model generating unit 120 simulates, as a relational expression, an invariant relationship established when the power storage systems #1 to #N are normal. Specifically, regarding the relational expression of the invariant relationship, correlation relationships present between pieces of performance information, which are indicated by the sensor values of the power storage systems, are analyzed, and one in which the pieces of performance information are always in conjunction with each other is extracted as such a relational expression.

In the first example embodiment, the model generating unit 120 generates, as a detection model of the relational expression indicating the invariant relationship, a correlation relationship between PCS battery voltages (average value) of sixteen power storage systems and maximum inter-cell voltages of the BMUs of sixteen power storage systems. In the example of the first example embodiment, the model generating unit 120 generates the detection model, for example, by using data of the PCS battery voltages and the maximum inter-cell voltages of the BMUs of the power storage systems for three days to one week.

Figure 4A:
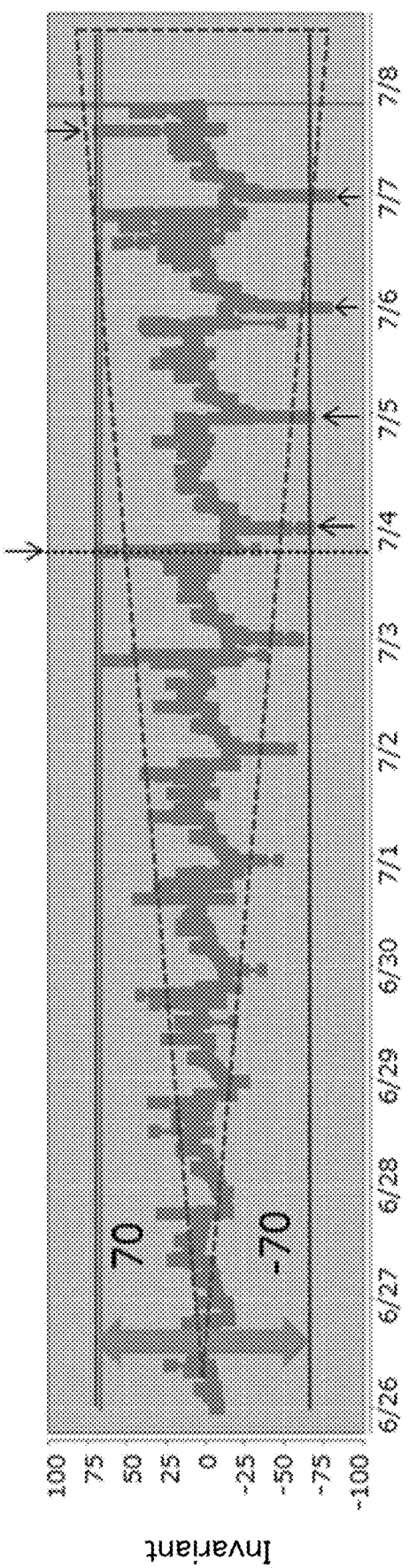
FIG. 4A is a graph illustrating time-series data of differences between actually measured values and predicted values of a detection model generated by sensor values of the clustered power storage systems.
Figure 4B:
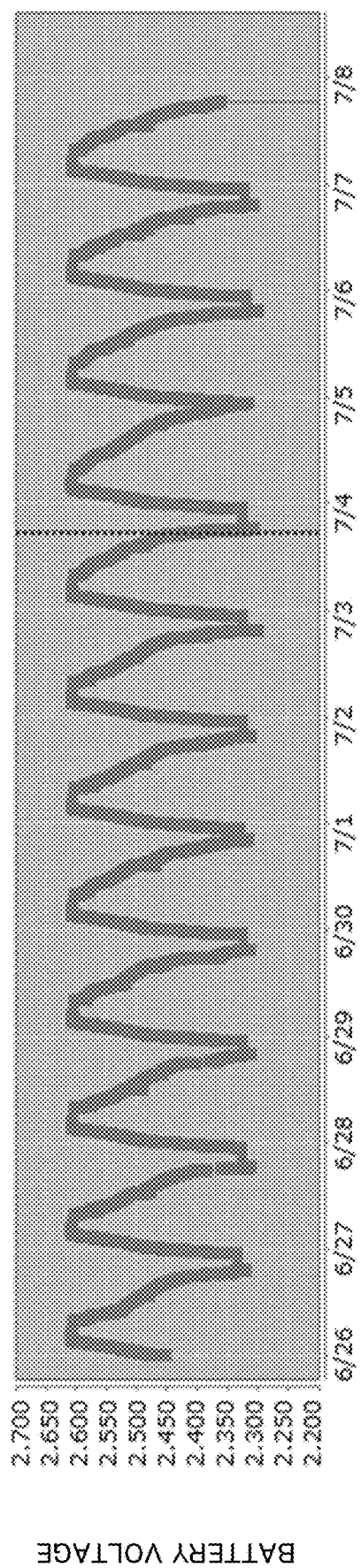
FIG. 4B is a graph illustrating time-series data of a battery voltage in a power conditioning system (PCS).
Figure 4C:
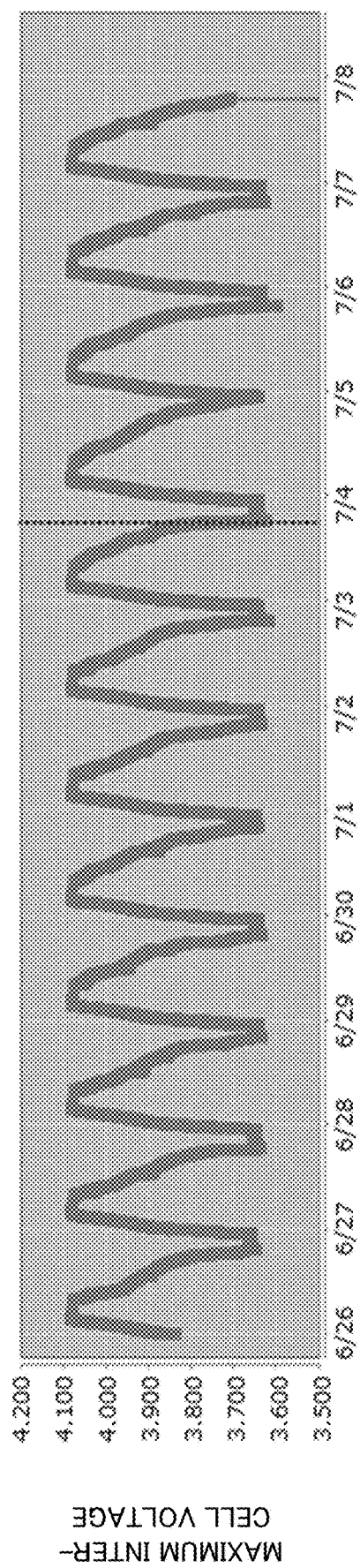
FIG. 4C is a graph illustrating time-series data of a maximum inter-cell voltage in a battery management unit (BMU).

FIGS. 4A to 4C are examples of generating the detection model for sixteen power storage systems included in a certain cluster among the plurality of clusters thus clustered. By the clustering, the sixteen power storage systems in the certain cluster become an aggregate in which the power storage systems are similar to one another in terms of the operation. Therefore, in the detection model generated by the sensor values of the clustered power storage systems, model accuracy is increased more than in a detection model made by power storage systems which are not clustered. By the fact that the model accuracy is increased, a margin of a threshold value, in which an individual difference between the power storage systems is considered, can be reduced, and as a result, a capability of detecting the anomalies in the power storage systems is increased.

FIG. 4B is time-series data of the battery voltage in the PCS, in which a vertical axis represents the battery voltage, and a horizontal axis represents a date (month and day). FIG. 4C is time-series data of the maximum inter-cell voltage in the BMU, in which a vertical axis represents the maximum inter-cell voltage, and a horizontal axis represents a date (month and day).

Next, the anomaly detection unit 130 compares a predicted value, which is derived by using the detection model corresponding to the cluster, and an actually measured value (sensor value) acquired from each of the power supply systems, with each other, and detects the anomaly in the power storage system from a breakdown of the relational expression of the invariant relationship. For example, when a difference between the predicted value and the actually measured value exceeds a certain threshold value, the anomaly detection unit 130 detects that such an anomaly in which the invariant relationship in the power storage system breaks down has occurred.

As in the cluster of the sixteen power storage systems, also for other clusters, the anomaly detection unit 130 detects the anomaly in the power storage system for each of the clusters.

FIG. 4A is time-series data of the difference between the predicted value and the actually measured value according to the first example embodiment. A vertical axis is the difference between the predicted value and the actually measured value, and a horizontal axis represents a date (month and day). The difference between the predicted value and the actually measured value, which is illustrated in FIG. 4A, tends to be gradually increased with the elapse of the date. A threshold value for the anomaly detection, which is derived from the sixteen power storage systems, takes a range of −70 to 70. In the example of FIG. 4A, anomalies in the power storage systems, which deviate from the range of the threshold value of −70 to 70, are detected six times.

Figure 5A:
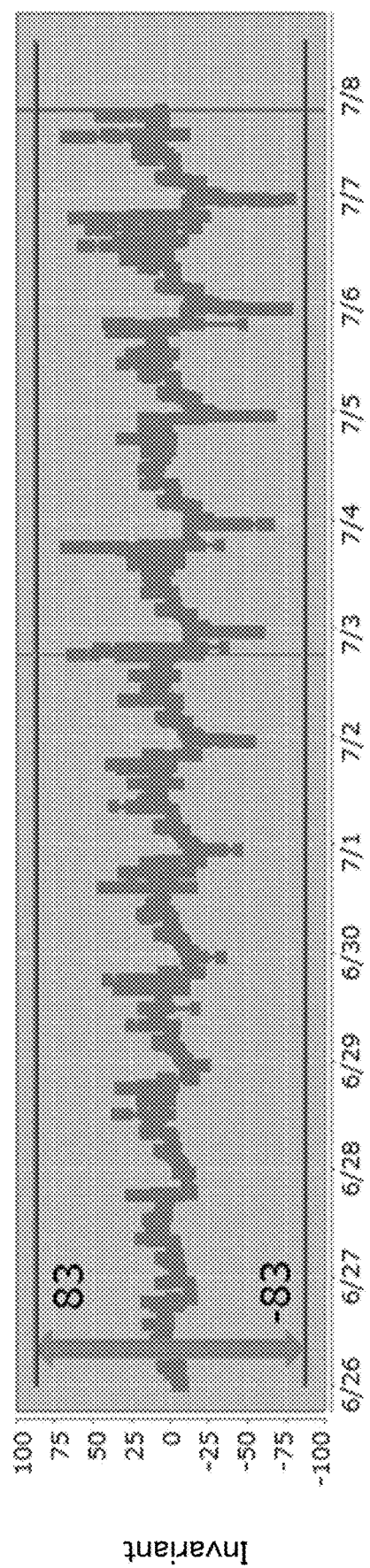
FIG. 5A is differences between actually measured values and predicted values of a detection model generated by sensor values of randomly selected power storage systems.
Figure 5B:
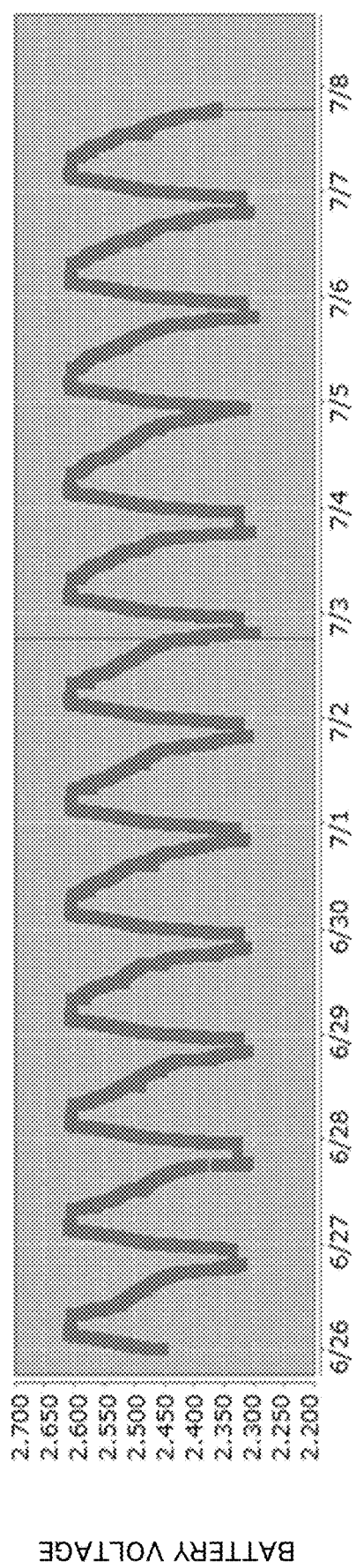
FIG. 5B is a graph illustrating time-series data of a battery voltage in a PCS.
Figure 5C:
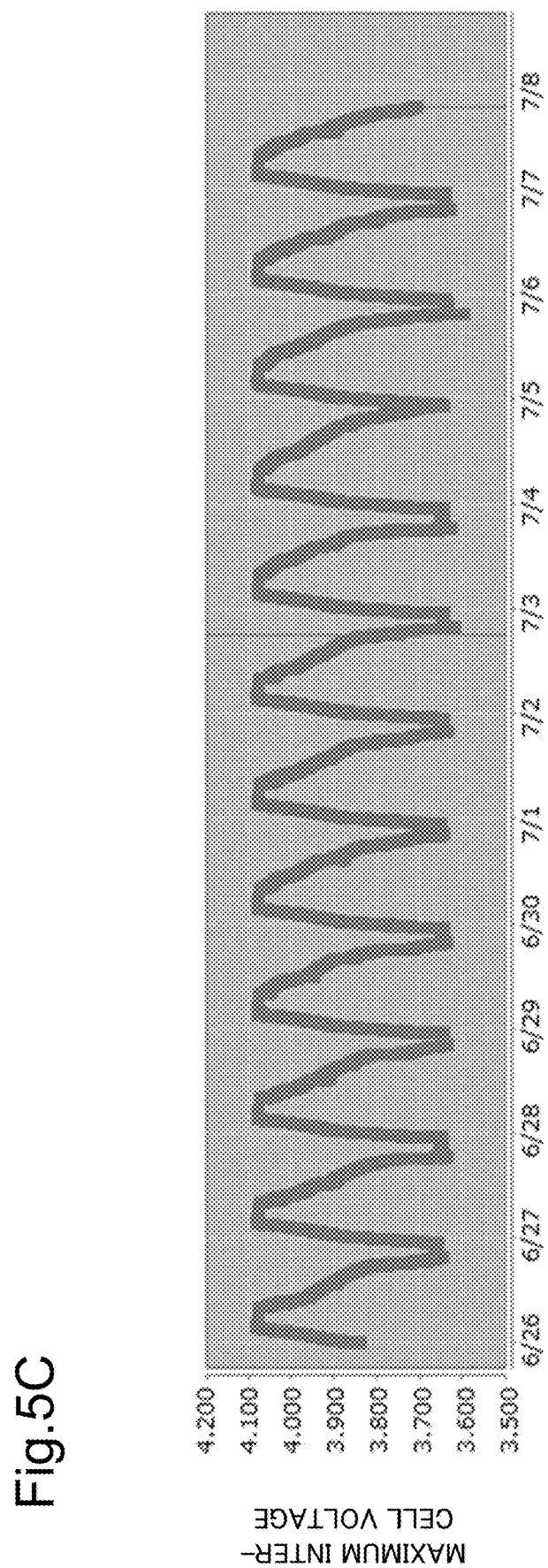
FIG. 5C is a graph illustrating time-series data of a maximum inter-cell voltage in a BMU.

FIGS. 5A to 5C are graphs illustrating a comparative example of generating a detection model by data of randomly extracted power storage systems and detecting anomalies. The number of randomly extracted power storage systems is set to sixteen as in the examples of FIGS. 4A to 4C. FIG. 5B is time-series data of the battery voltage in the PCS, in which a horizontal axis represents a date (month and day). FIG. 5B and FIG. 5C are a PCS battery voltage and a BMU maximum inter-cell voltage each in the randomly selected sixteen power storage systems.

FIG. 5A is differences between actually measured values and predicted values of a detection model generated by sensor values of the randomly selected sixteen power storage systems. In the randomly extracted power storage systems, it is necessary to broadly ensure a margin of the threshold value in consideration of an individual difference between the power storage systems. Therefore, a threshold value illustrated in FIG. 5A takes a range of −83 to 83. As described above, the anomaly detection device of the first example embodiment becomes capable of narrowing the range of the threshold value for the anomaly detection more than in the comparative example, and can improve the performance for detecting the anomalies in the power storage systems.

Figure 6:
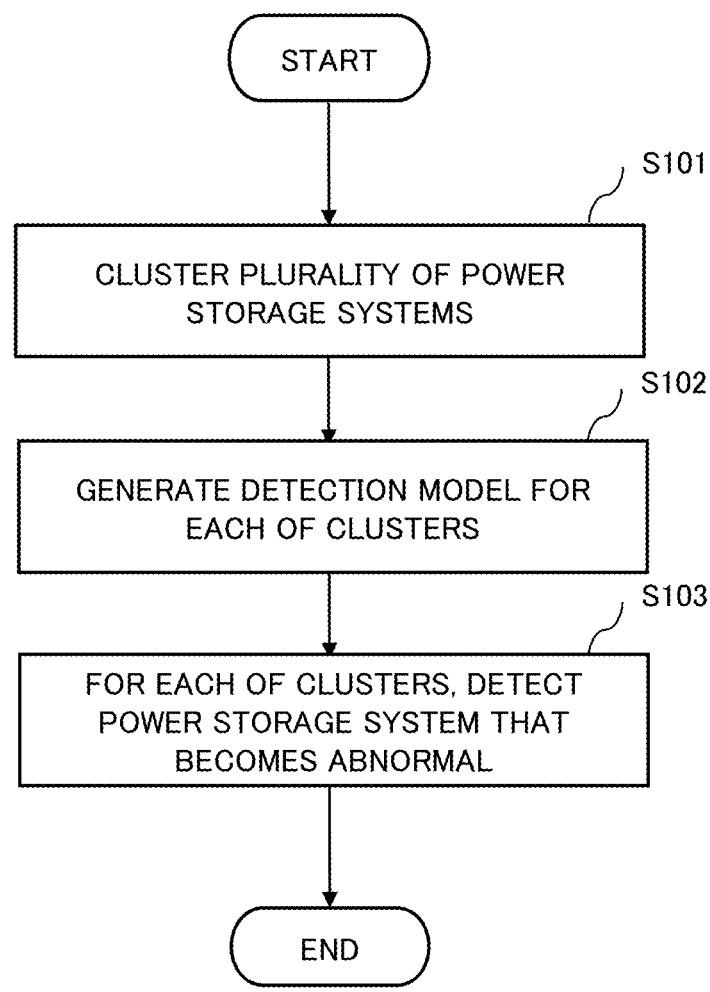
FIG. 6 is a flowchart illustrating one example of an operation of the anomaly detection device according to the first example embodiment.

Next, an operation of the anomaly detection device according to the first example embodiment will be described with reference to the drawings. FIG. 6 is a flowchart illustrating one example of an operation of the anomaly detection device 100 according to the first example embodiment. As illustrated in FIG. 6, the anomaly detection device 100 executes the following processing.

The clustering unit 110 clusters a plurality of power storage systems into a plurality of clusters on the basis of sensor values indicating states of the power storage systems (Step S101).

The model generating unit 120 generates a detection model for detecting anomalies in the power storage systems for each of the clusters (Step S102).

The anomaly detection unit 130 detects the anomalies in the power storage systems for each of the clusters by using the detection model generated in response to the cluster (Step S103).

Effects of the anomaly detection device according to the first example embodiment will be described. According to the anomaly detection device according to the first example embodiment, the performance for detecting the anomaly in the power storage system can be improved. The anomaly detection device according to the first example embodiment generates the detection model for clustering the plurality of power storage systems into the plurality of clusters on the basis of the sensor values indicating the states of the power storage systems, and for detecting the anomalies in the power storage systems for each of the clusters.

Thus, in comparison with the case of using such a detection model generated by the data of the power storage systems randomly selected from the plurality of power supply systems, reduced is an operational difference for each of the power storage systems or a difference in influence due to installation environments of the power storage systems. Moreover, by the clustering, the power storage systems in each of the clusters become an aggregate in which the power storage systems are similar to one another in terms of the operation. Therefore, the margin in which the individual difference between the power storage systems is considered can be reduced at the time of setting the threshold value. The range of the threshold value is narrowed, thus making it possible to improve the performance of the anomaly detection device for detecting the anomalies.

Modified Example

A modified example of the anomaly detection device according to the first example embodiment will be described. The anomaly detection device 100 has been described by using the example in which the anomaly detection targets are power storage systems for home. However, the anomaly detection device 100 is also applicable to other power storage systems. Moreover, the generating of the detection model and the anomaly detection from the power storage systems by the generated detection model are not limited to the invariant analysis, and other methods are applicable thereto.

In the first example embodiment, the storage batteries included in the power storage systems have been described by using the example in which the storage batteries are lithium ion batteries. However, the storage batteries may be other chargeable/dischargeable storage batteries. For example, the storage batteries may be general storage batteries such as lead, lithium ion, lithium ion polymer, nickel/hydrogen, and nickel/cadmium ones. Moreover, the storage batteries may be liquid circulation storage batteries such as redox flow, zinc/chlorine and zinc/bromine ones. Alternatively, the storage batteries may be mechanical charge storage batteries, or high-temperature operation storage batteries.

In the first example embodiment, the description has been given of the example in which the clustering unit 110 of the anomaly detection device 100 clusters the plurality of power storage systems into the plurality of clusters by using the hierarchical method and the DTW. However, the present disclosure is not limited to this. Other methods may be used if an aggregate to be classified can be divided into such subsets in which internal bonding and external isolation are achieved.

Figure 7:
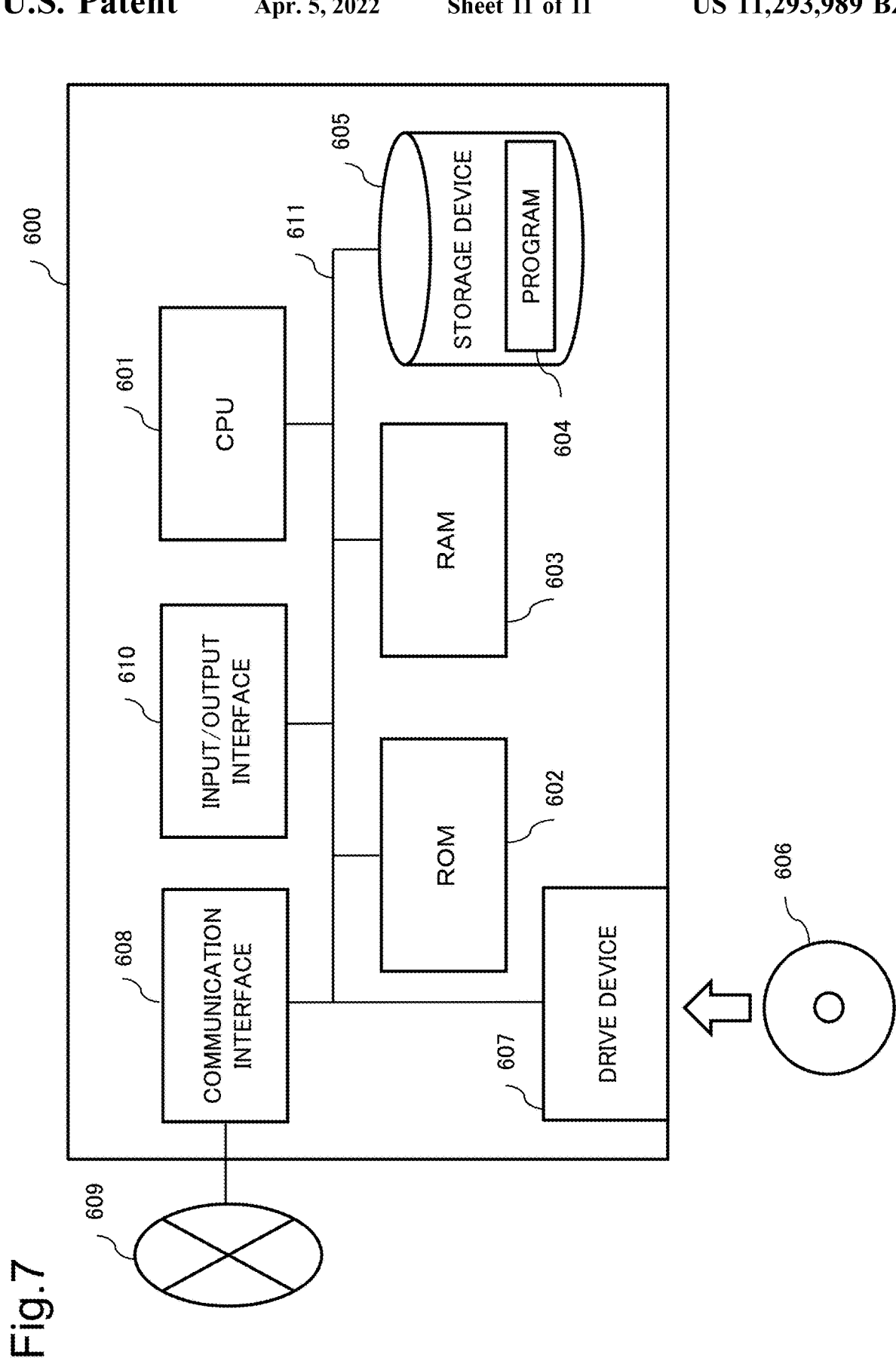
FIG. 7 is a block diagram illustrating a hardware configuration diagram when the anomaly detection device according to the first example embodiment is generated by a computer.

The anomaly detection device 100 according to the first example embodiment is achievable by using a computer and a program executed on the computer. FIG. 7 is a diagram illustrating a hardware configuration in a case when the anomaly detection device according to the first example embodiment is achieved by a computer. In the first example embodiment, each of the components ( ) of the anomaly detection device 100 indicates a functional block. A part or all of the components are achieved, for example, by any combinations of a computer 600 as illustrated in FIG. 7 and programs. As one example, the computer 600 includes a configuration as below.

A central processing unit (CPU) 601
A read only memory (ROM) 602
A random access memory (RAM) 603
A program 604 to be loaded in the RAM 603
A storage device 605 that stores the program 604
A drive device 607 that performs reading and writing with a recording medium 606
A communication interface 608 to be connected to a communication network 609
An input/output interface 610 that inputs and outputs data
A bus 611 that connects the components to one another The components (clustering unit 110, model generating unit 120, anomaly detection unit 130) of the anomaly detection device 100 are achieved in such a way that the CPU 601 acquires and executes the program 604 that achieves these functions. For example, the program 604 that achieves the functions of the components is stored in the storage device 605 or the RAM 603 in advance, and is read by the CPU 601 according to needs. Note that, the program 604 may be supplied to the CPU 601 via the communication network 609, or may be stored in the recording medium 606 in advance, and the drive device 607 may read out the program and supply the program to the CPU 601.

Methods of achieving the anomaly detection device 100 include various modified examples. For example, the anomaly detection device 100 may be achieved by any combination of a computer 600, which is separate for each component, and a program. Moreover, a plurality of the components provided in the anomaly detection device 100 may be achieved by any combination of a single computer 600 and a program.

Moreover, a part or all of the components of the anomaly detection device 100 are achieved by other general-purpose or dedicated circuitry, processors and the like and combinations thereof. Such components may be composed of a single chip, or may be composed of a plurality of chips connected to one another via a bus. In place of the computer 600, such a programmable logic device as a field-programmable gate array (FPGA) may be used.

Moreover, a part or all of the components of the anomaly detection device 100 may be achieved by combinations of the above-mentioned circuitry and the like and a program.

When a part or all of the components of the anomaly detection device 100 are achieved by pluralities of information processing apparatuses, circuitries and the like, the pluralities of information processing apparatuses, circuitries and the like may be arranged centrally, or may be arranged dispersedly. For example, the information processing apparatuses, the circuitries and the like may be achieved as a mode in which the components are connected to one another via a communication network, the mode including a client and server system, a cloud computing system and the like.

While the disclosure has been particularly shown and described with reference to exemplary embodiments thereof, the disclosure is not limited to these embodiments. It will be understood by those of ordinary skill in the art that various changes in form and details may be made therein without departing from the spirit and scope of the present disclosure as defined by the claims.

REFERENCE SIGNS LIST

100 Anomaly detection device
110 Clustering unit
120 Model generating unit
130 Anomaly detection unit

The invention claimed is:

1. An anomaly detection device comprising:
at least one memory configured to store instructions; and
at least one processor configured to execute the instructions to:
cluster a plurality of power storage systems into a plurality of clusters based on a time-series fluctuation of information indicating a state of the power storage system;
generate a detection model for detecting an anomaly in the power storage system for each of the clusters; and
detect an anomaly in the power storage system for each of the clusters by using the detection model associated with the cluster, wherein
the detection model is generated by using a plurality of sensor values indicating normal states of the power storage systems in the same cluster.

2. The anomaly detection device according to claim 1, wherein
the information is information indicating a state of charge of the power storage system.

3. The anomaly detection device according to claim 1, wherein
the information further includes information distinguished between weekdays and holidays.

4. The anomaly detection device according to claim 1, wherein
the information is values by acquiring moving averages of time-series data of the information.

5. The anomaly detection device according to claim 1, wherein
the plurality of clusters are clustered according to operations of the power storage systems.

6. The anomaly detection device according to claim 1, wherein
the at least one processor is configured to execute the instructions to cluster the plurality of power storage systems into the plurality of clusters, based on the information further including a manufacturer name or a model number of the power storage system.

7. An anomaly detection method comprising:
clustering a plurality of power storage systems into a plurality of clusters based on a time-series fluctuation of information indicating a state of the power storage system;
generating a detection model for detecting an anomaly in the power storage system for each of the clusters; and
detecting an anomaly in the power storage system for each of the clusters by using the detection model associated with the cluster, wherein
the detection model is generated by using a plurality of sensor values indicating normal states of the power storage systems in the same cluster.

8. A non-transitory computer readable recording medium storing a program causing a computer to execute:
clustering a plurality of power storage systems into a plurality of clusters based on a time-series fluctuation of information indicating a state of the power storage system;
generating a detection model for detecting an anomaly in the power storage system for each of the clusters; and
detecting an anomaly in the power storage system for each of the clusters by using the detection model associated with the cluster, wherein
the detection model is generated by using a plurality of sensor values indicating normal states of the power storage systems in the same cluster.

9. The anomaly detection device according to claim 1, wherein
the detection model is a relational expression between PCS battery voltages of the power storage system and maximum inter-cell voltages of a BMUs of the power storage system.

* * * * *